(12) United States Patent
Chu et al.

(10) Patent No.: US 7,221,012 B2
(45) Date of Patent: May 22, 2007

(54) PIXEL ARRAY

(75) Inventors: Fang-Tsun Chu, Dali (TW); Yung-Hui Yeh, Hsinchu (TW)

(73) Assignee: Industrial Technology Research INstitute, Hsinchu (TW)

( * ) Notice: Subject to any disclaimer, the term of this patent is extended or adjusted under 35 U.S.C. 154(b) by 0 days.

(21) Appl. No.: 11/358,967

(22) Filed: Feb. 21, 2006

(65) Prior Publication Data

US 2007/0090420 A1    Apr. 26, 2007

(30) Foreign Application Priority Data

Sep. 13, 2005    (TW) .............................. 94131437 A

(51) Int. Cl.
*H01L 31/062*    (2006.01)
(52) U.S. Cl. ...................................... 257/291; 257/290
(58) Field of Classification Search .................. 257/88, 257/290–291, 233, 359, 316
See application file for complete search history.

(56) References Cited

U.S. PATENT DOCUMENTS

| | | | | |
|---|---|---|---|---|
| 5,389,775 A | * | 2/1995 | Kwasnick et al. | 250/208.1 |
| 5,435,608 A | * | 7/1995 | Wei et al. | 257/59 |
| 5,976,978 A | * | 11/1999 | Salisbury | 438/690 |
| 6,465,824 B1 | * | 10/2002 | Kwasnick et al. | 257/290 |
| 6,765,267 B2 | * | 7/2004 | Lai | 257/359 |

* cited by examiner

*Primary Examiner*—Roy Potter
(74) *Attorney, Agent, or Firm*—J.C. Patents

(57) ABSTRACT

A pixel array formed on a substrate mainly including scan lines and data lines is provided. The scan lines and the data lines are essentially consisted of conductive patterns disposed at different layers and contact windows electrically connected with the conductive patterns disposed at the different layers. The scan lines and the data lines are respectively consisted of conductive patterns to prevent the scan lines and the data lines from cracking when the substrate is warped. Besides, the pixel array further includes dielectric layers having trenches therein, to divide the dielectric layers into independent dielectric patterns. Thus, the dielectric layers would not crack easily when the substrate is warped.

18 Claims, 19 Drawing Sheets

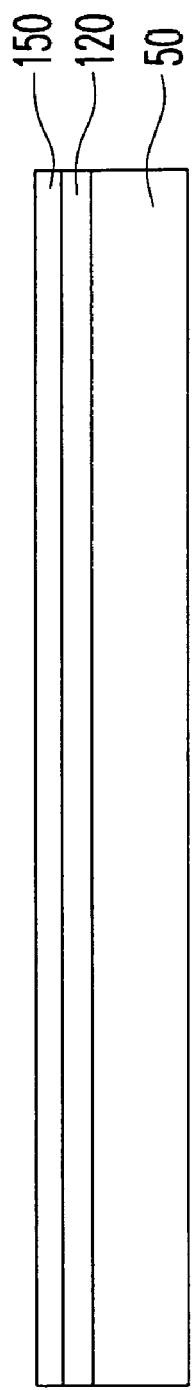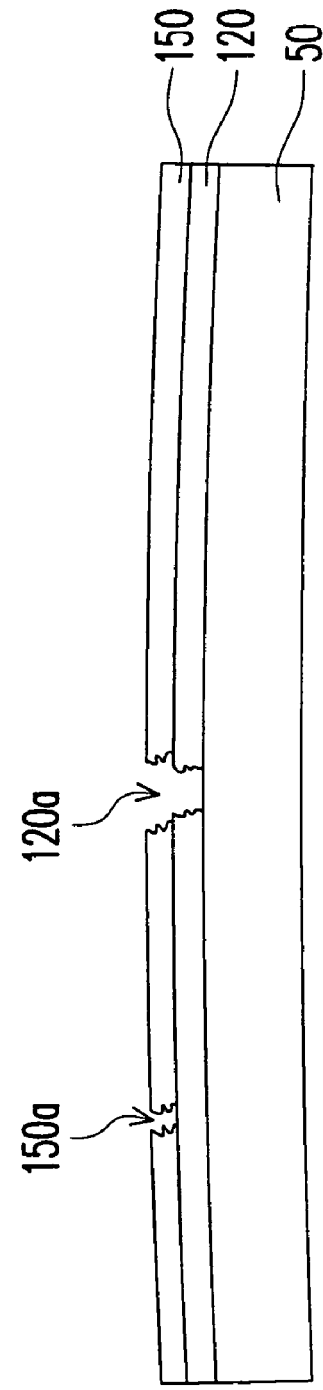
FIG. 1B (PRIOR ART)
FIG. 1C (PRIOR ART)

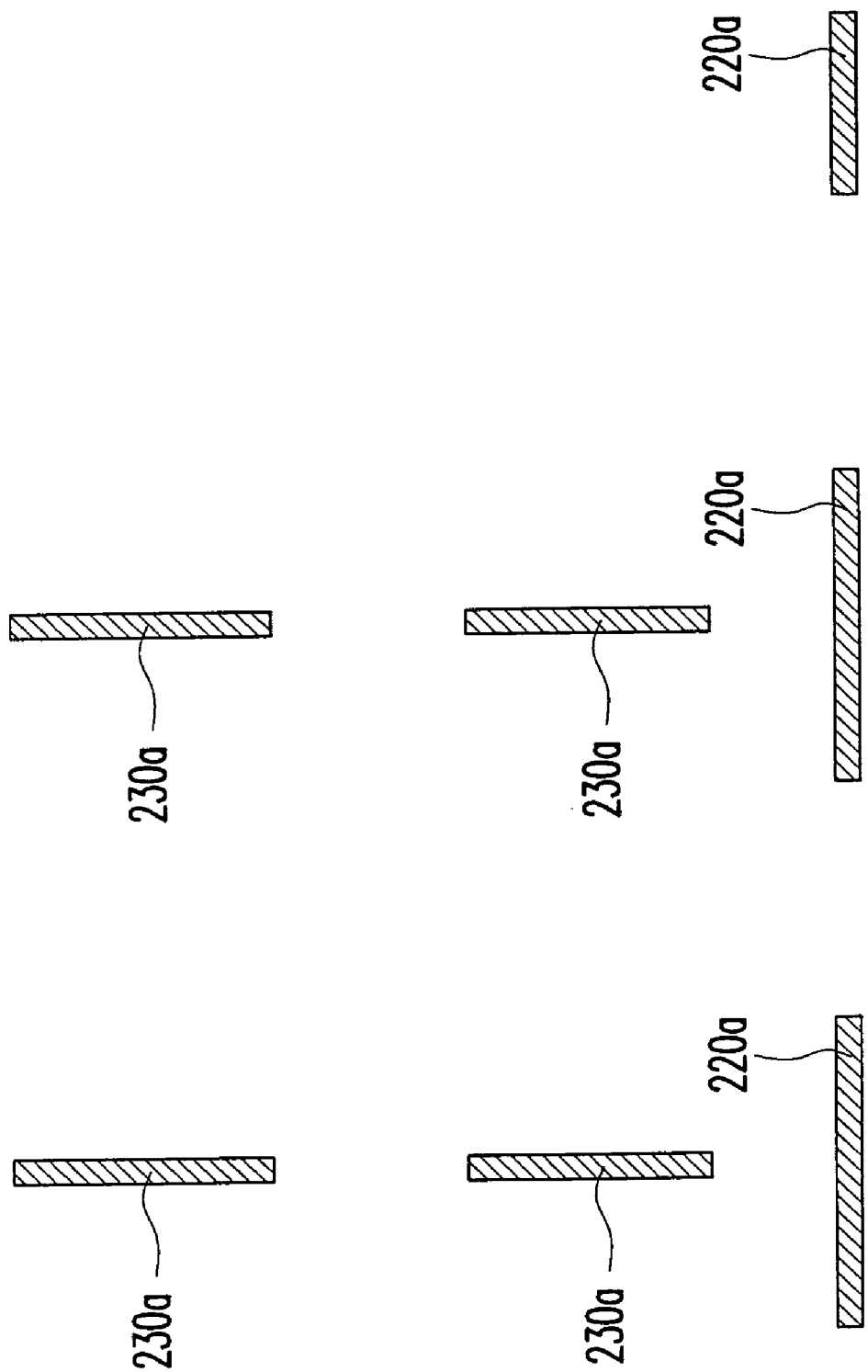

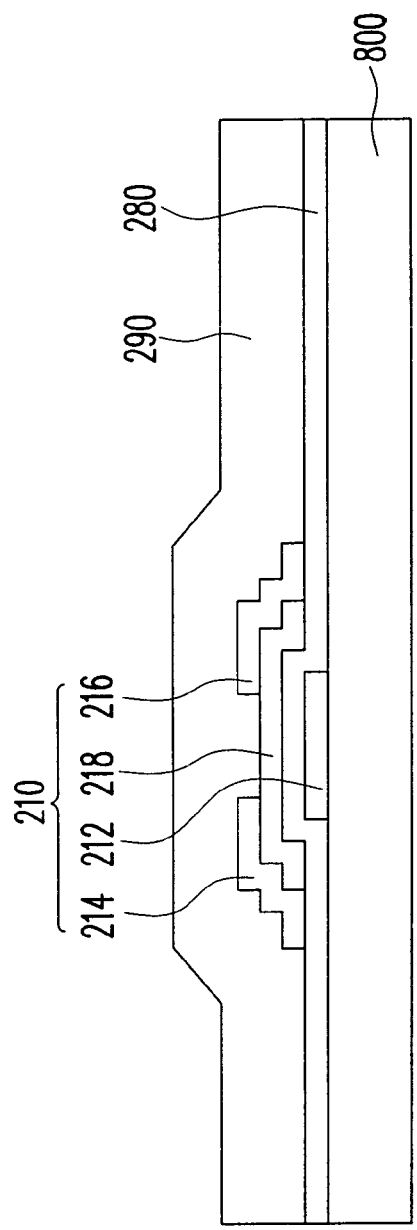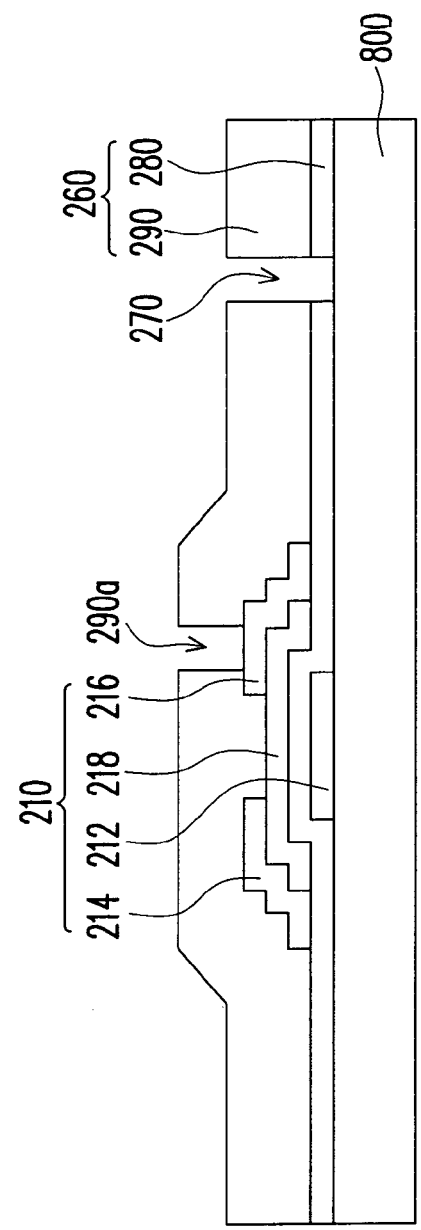
FIG. 5A
FIG. 5B

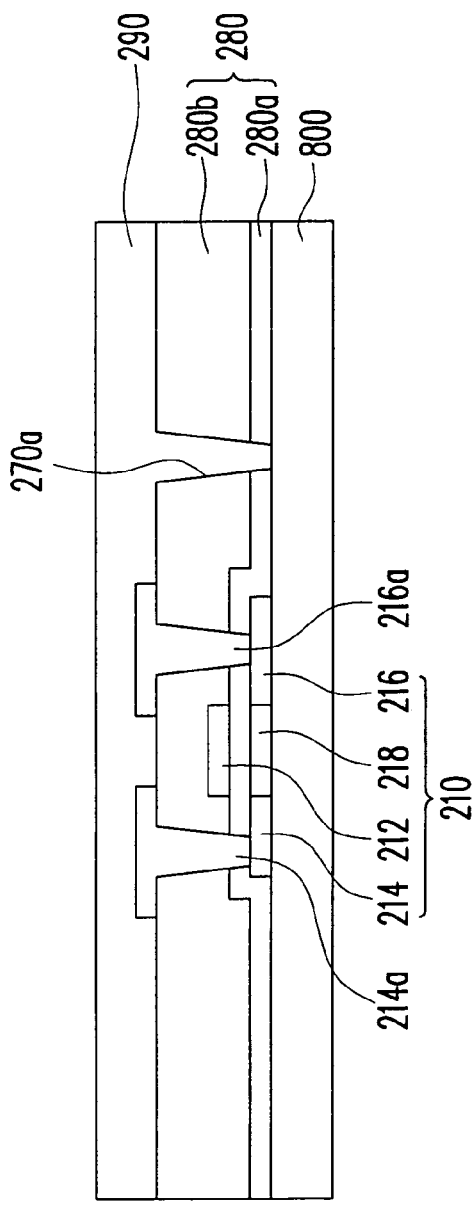
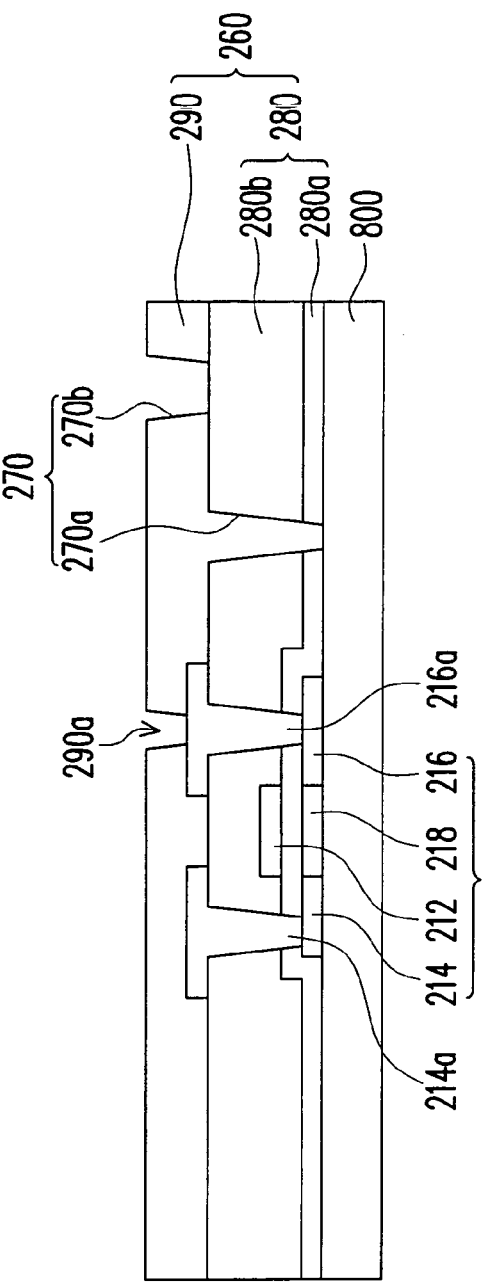
FIG. 7C
FIG. 7D

PIXEL ARRAY

CROSS-REFERENCE TO RELATED APPLICATION

This application claims the priority benefit of Taiwan application serial no. 94131437, filed on Sep. 13, 2005. All disclosure of the Taiwan application is incorporated herein by reference.

BACKGROUND OF THE INVENTION

1. Field of the Invention

The present invention generally relates to a pixel array, and more particularly, to a pixel array formed on a flexible substrate.

2. Description of Related Art

With recent advancement in video technology, different kinds of display devices have been applied to display screens of consumer electronic products such as cell phones, notebook computers, digital cameras and personal digital assistants (PAD) in a great quantity. Having the advantages of light weight, compact size and lower power consumption, LCDs (Liquid Crystal Display) and OLEDs (Organic Electro-Luminescence Display) have become the mainstream in the market. No matter an LCD or an OLED, the fabrication process of both displays comprises the step of forming a pixel array on a substrate by using a semiconductor process. The image displayed on the display devices is generated by adjusting the colour of each pixel of the pixel array. However, in order to make the electronic devices portable (as designed in a foldable structure), the pixel array is formed on a flexible substrate so that the displays will have flexibility to be assembled with the electronic products.

FIG. 1A is a partial vertical view showing a conventional pixel array. Please refer to FIG. 1A, the pixel array 100 formed on a flexible substrate 50 is composed of a plurality of pixels 100a arranged in a matrix. The pixel array 100 comprises a plurality of thin film transistors 110, a plurality of scan lines 120, a plurality of data lines 130 and a plurality of pixel electrodes 140. Each thin film transistor 110 is electrically connected to the corresponding scan line 120, data line 130 and pixel electrode 140; and the thin film transistor 110 is turned on or turned off according to the scan signals transmitted from the scan line 120. When the thin film transistor 110 is turned on, the pixel electrode 140 receives the data signal transmitted from the data line 130 to make the corresponding pixel 100a adjust its colour.

FIG. 1B is a schematic cross-sectional view of FIG. 1A taken along line A-A'. FIG. 1C is a schematic view showing the flexible substrate of FIG. 1B after it is warped. Please refer to FIGS. 1A, 1B and 1C. In general, the method of forming the scan lines 120 comprises the following steps. First, a metal layer is deposited on the flexible substrate 50, and then the metal layer is patterned by using a photolithography process to form the scan lines 120. However, during the process of warping the flexible substrate 50, the strain stress or tensile stress generated from the flexible substrate 50 would damage the pixel array 100 disposed thereon, particular the longer lines, such as the scan lines 120, and a break 120a occurs in the scan line 120 as shown in FIG. 1C.

Besides, a dielectric layer 150 covers the scan lines 120 as shown in FIGS. 1B and 1C. Similarly, when the strain stress or tensile stress generated from the flexible substrate 50 is applied to the large-sized dielectric layer 150, a crack 150a would easily occur. The cracks of the dielectric layer 150 may cause the problem of short circuit and result in defects of the pixel array 100.

The above-mentioned problems may also occur in the data lines, other lines or dielectric layers of the pixel array. Therefore, it is important to prevent the lines or film layers formed on the flexible substrate of the pixel array from cracking.

SUMMARY OF THE INVENTION

Accordingly, one purpose of the present invention is to provide a pixel array, wherein the scan lines and the data lines are composed of conductive patterns disposed at different layers. Therefore, when the substrate is warped, the scan lines and the data lines would not crack.

A second purpose of the present invention is to provide a pixel array utilizing a trench disposed in the dielectric layer to divide the dielectric layer into a plurality of independent dielectric patterns. This design can prevent the dielectric layer from cracking when the substrate is warped.

As embodied and broadly described herein, the present invention provides a pixel array comprising a plurality of active devices disposed on a substrate, a plurality of scan lines and a plurality of data lines electrically connected to the active devices, and a plurality of pixel electrodes electrically connected to the active devices. The pixel array characterizes in that each scan line comprising a plurality of first scan line patterns disposed in a first layer, a plurality of second scan line patterns disposed in an second layer and a plurality of first contact windows, which electrically connect the first scan line patterns and the second scan line patterns. Each data line comprises a plurality of first data line patterns disposed in the first layer, a plurality of second data line patterns disposed in the second layer and a plurality of second contact windows electrically connecting the first data line patterns and the second data line patterns.

According to an embodiment of the present invention, the pixel array further comprises a plurality of common lines. Each common line comprises a plurality of first common line-patterns disposed in the first layer, a plurality of second common line patterns disposed in the second layer and a plurality of third contact windows electrically connecting the first common line patterns and the second common line patterns.

According to an embodiment of the present invention, the pixel array further comprises a plurality of wires disposed on the substrate. Each wire comprises a plurality of first wire patterns disposed in the first layer, a plurality of second wire patterns disposed in the second layer and a plurality of fourth contact windows electrically connecting the first wire patterns and the second wire patterns.

According to an embodiment of the present invention, the substrate is a flexible substrate. The material of the flexible substrate comprises plastic, metal foil or stainless steel.

According to an embodiment of the present invention, the pixel array further comprises a plurality of dielectric layers respectively disposed between the pixel electrodes and the data lines, and the scan lines and the data lines. The dielectric layer has at least one trench therein, so as to divide the dielectric layer into a plurality of independent dielectric patterns.

According to an embodiment of the present invention, a material of the dielectric layer comprises inorganic material or organic material.

According to an embodiment of the present invention, the active devices are top gate thin film transistors; the dielectric layer comprises a lower dielectric layer and an upper dielectric layer. The trench comprises a first trench disposed in the lower dielectric layer and a second trench disposed in the upper dielectric layer, and the first trench and the second trench are staggered.

According to an embodiment of the present invention, the active devices are bottom gate thin film transistors.

As embodied and broadly described herein, the present invention provides a pixel array comprising a plurality of active devices, a plurality of scan lines, a plurality of data lines and a plurality of pixel electrodes disposed on a substrate. The active devices are electrically connected to the corresponding scan lines, data lines and pixel electrodes. The pixel array characterizes in that a dielectric layer is disposed between the pixel electrode and the scan lines, and the scan lines and the data lines respectively, wherein the dielectric layers have at least one trench therein so as to divide the dielectric layer into a plurality of independent dielectric patterns.

According to an embodiment of the present invention, the active devices are top gate thin film transistors, and the dielectric layer comprises a lower dielectric layer and an upper dielectric layer. The trench comprises a first trench disposed in the lower dielectric layer and a second trench disposed in the upper dielectric layer. The first trench and the second trench are staggered.

According to an embodiment of the present invention, the active devices are bottom gate thin film transistors.

According to an embodiment of the present invention, the substrate is a flexible substrate. The material of the flexible substrate comprises plastic, metal foil or stainless steel.

According to an embodiment of the present invention, a material of the dielectric layer comprises inorganic material or organic material.

In summary, the scan lines, the data lines, the common lines or other wires in the pixel array of the present invention can be composed of the conductive patterns disposed at different layers and the contact windows for electrically connecting the conductive patterns at different layers. When the substrate is warped, this design can prevent the scan lines, the data lines, the common lines or other wires from cracking. Besides, the dielectric layers are divided into a plurality of independent dielectric patterns by forming the trench therein. When the substrate is warped, the dielectric layers would not crack easily. Thus, the quality and the reliability of the pixel array can be enhanced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1B is a schematic cross-sectional view of FIG. 1 taken along line A-A'.

FIG. 1C is a schematic view showing a warped flexible substrate shown in FIG. 1B.

FIGS. 2A to 2C are schematic views illustrating the process flow for fabricating a pixel array according to a first embodiment of the present invention.

FIGS. 5A to 5C are schematic cross-section views illustrating the process flow for fabricating a pixel array according to a third embodiment of the present invention.

FIGS. 7A to 7E are schematic cross-section views illustrating the process flow for fabricating a pixel array according to a fourth embodiment of the present invention.

DESCRIPTION OF THE EMBODIMENTS

Figure 1A:
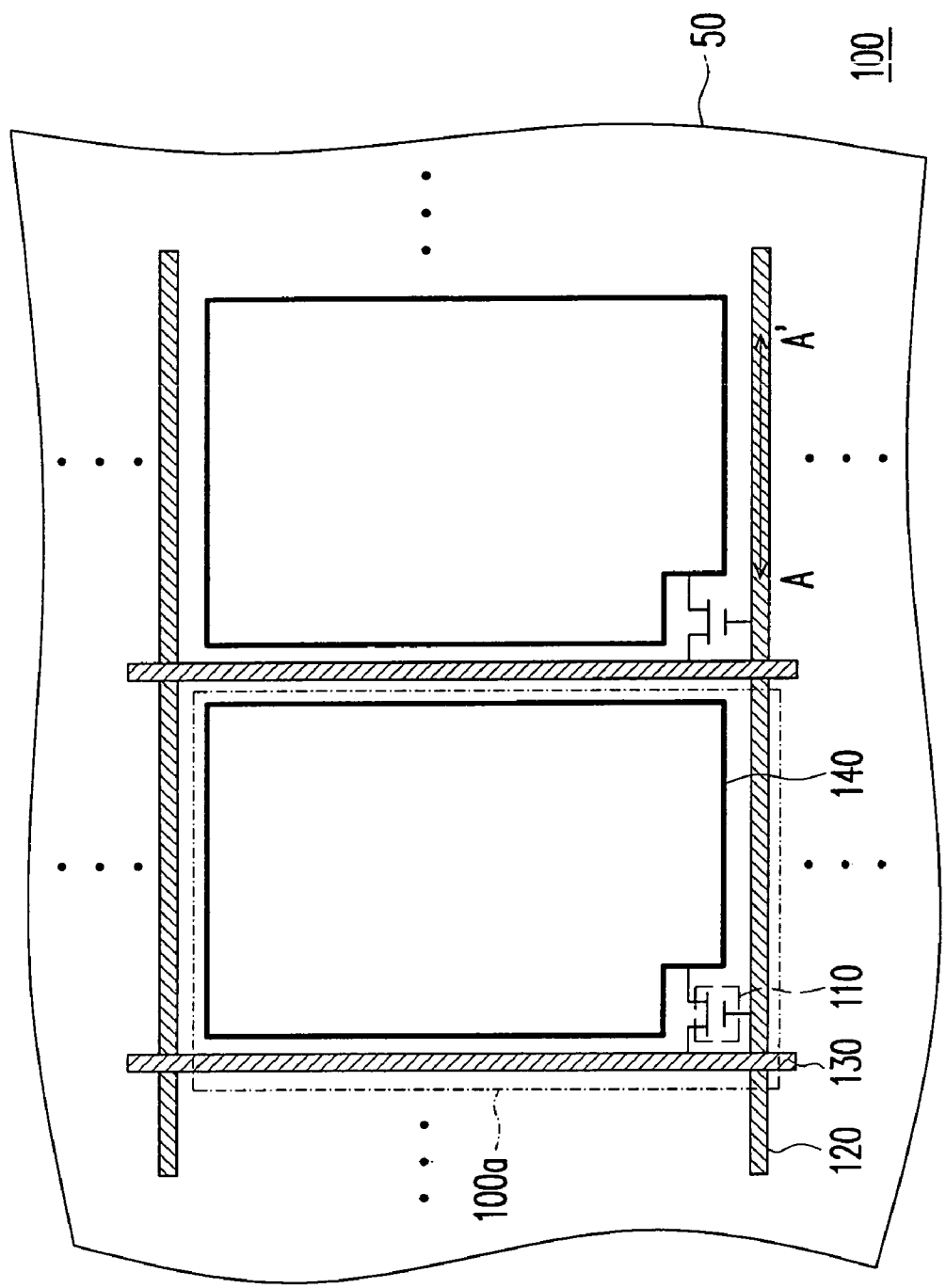
FIG. 1A is a partial schematic drawing showing a conventional pixel array.

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 2B:
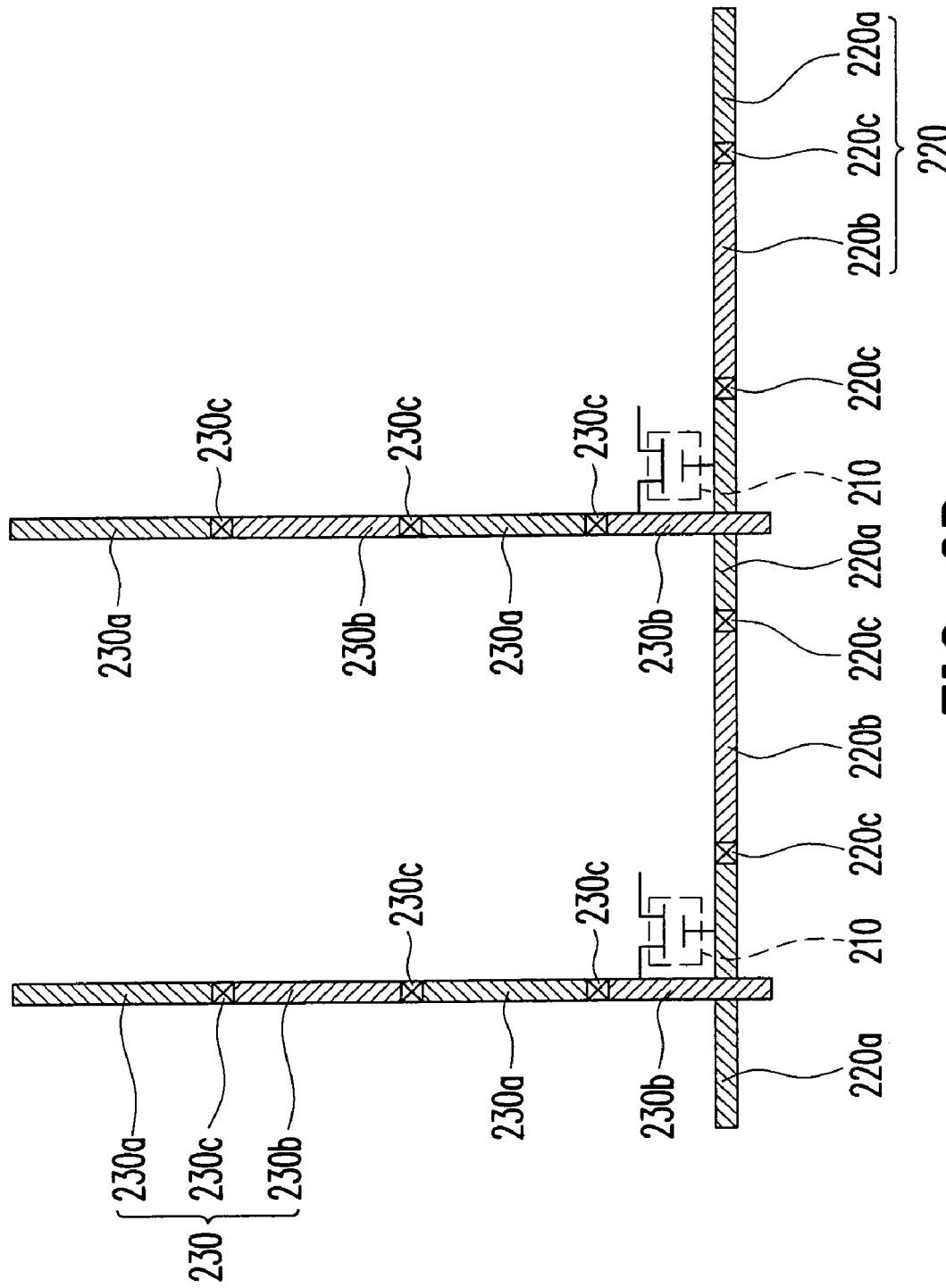
Figure 2C:
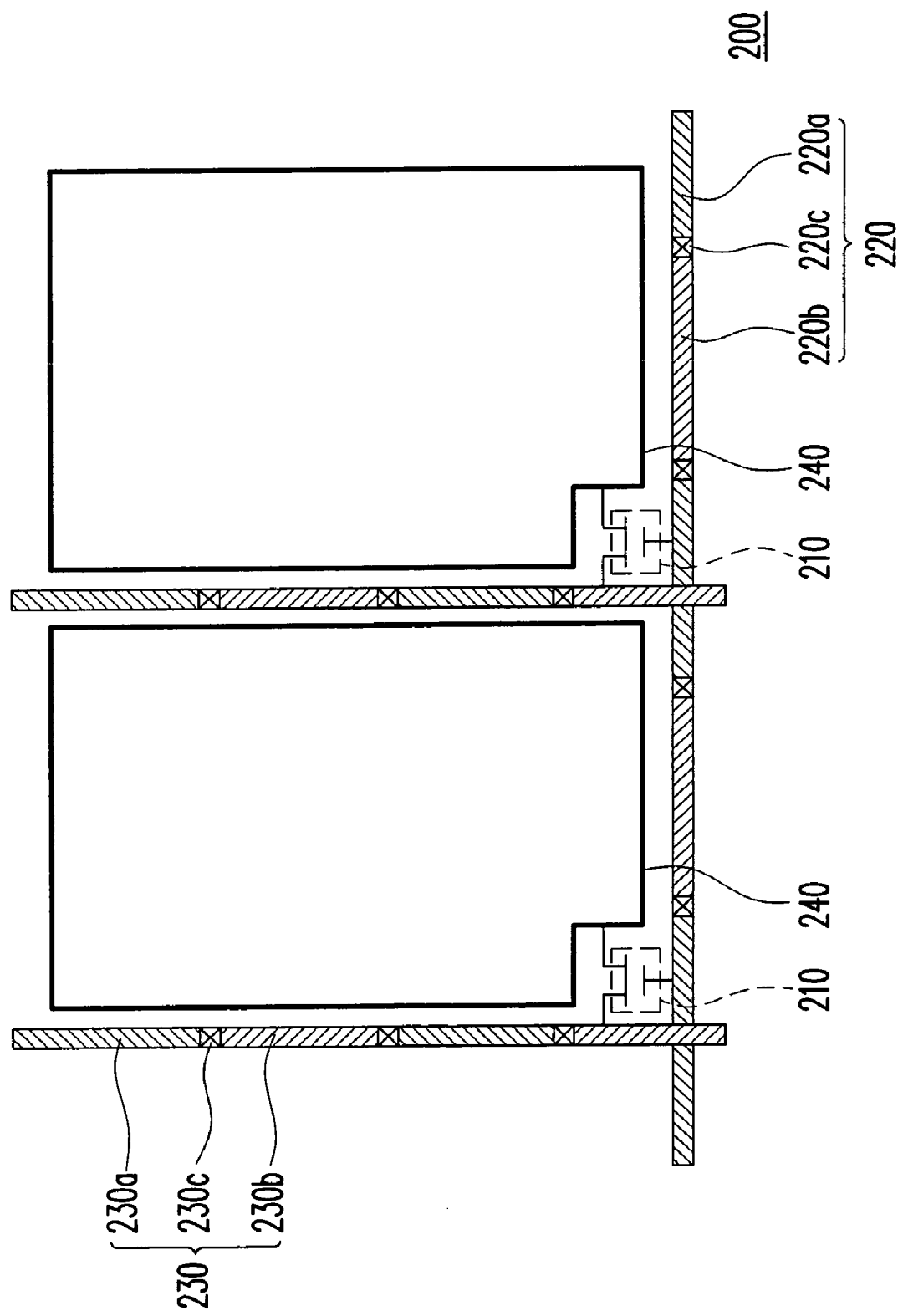

FIGS. 2A to 2C are schematic views illustrating the process flow for fabricating a pixel array according to a first embodiment of the present invention. Please refer to FIG. 2A, a conductive layer is deposited on a substrate (not shown), and then the conductive layer is patterned by a photolithography process and an etching process to form a plurality of first scan line patterns 220a and a plurality of first data line patterns 230a. Because the length of each first scan line pattern 220a and first data line pattern 230a is limited, the strain stress and tensile stress applied to the first scan line patterns 220a and first data line patterns 230a are smaller, and the first scan line patterns 220a and first data line patterns 230a would not crack easily when the substrate is warped or bent. Next, a lower dielectric layer (not shown) is formed on the first scan line patterns 220a and first data line patterns 230a for protecting the first scan line patterns 220a and first data line patterns 230a.

Please refer to FIG. 2B, a conductive layer is subsequently deposited on the lower dielectric layer, and then the conductive layer is patterned by a photolithography process and an etching process to form a plurality of second scan line patterns 220b and a plurality of second data line patterns 230b. Similarly, because the length of each second scan line pattern 220b and second data line pattern 230b is limited, the second scan line patterns 220b and second data line patterns 230b would not crack easily when the substrate is warped. Besides, the first scan line patterns 220a can be electrically connected to the second scan line patterns 220b via a plurality of first contact window 220c. Thus, the first scan line patterns 220a, the second scan line patterns 220b and the first contact windows 220c constitute a plurality of scan lines 220. In this embodiment, the first contact window 220c can be formed by the following steps. First, a first contact window opening (not shown) is formed in the lower dielectric layer to expose the first scan line pattern 220a. Next, the first contact window opening is filled with the material, which the second scan line pattern 220b is composed of, so as to form the first contact window 220c. Similarly, the first data line patterns 230a are electrically connected to the second data line patterns 230b via the second contact windows 230c, so as to form a plurality of data lines 230.

Particularly, when forming the first scan line patterns 220a, the second scan line patterns 220b, the first data line patterns 230a and the second data line patterns 230b on the substrate, a plurality of active devices 210 can be formed simultaneously. The active devices 210 are electrically connected to the corresponding scan lines 220 and data lines 230 respectively. After that, an upper dielectric layer is formed to protect the active devices 210, the scan lines 220 and the data lines 230.

Then, please refer to FIG. 2C, a plurality of pixel electrodes 240 electrically connected to the corresponding active devices 210 are formed. Thus far, the pixel array 200 is formed according to the above processes. In the present invention, the scan lines 220 and the data lines 230 are composed of a plurality of conductive patterns. When the substrate is warped, the strain stress or tensile stress applied to the scan lines 220 and the data lines 230 composed of several conductive patterns are smaller, and they would not crack easily. Accordingly, the quality and reliability of the pixel array 200 can be enhanced. It should be noted that the above-mentioned first contact window 220c can be formed by other suitable processes. For example, a contact window (not shown) is formed in the lower dielectric layer and the upper dielectric layer to expose the first scan line pattern 220a, and then another contact window (not shown) is formed in the upper dielectric layer to expose the second scan line pattern 220b. Next, the material of the pixel electrode 240 is filled with the above-mentioned contact window to form the first contact window 220c. Similarly, the second contact window 230c can be formed by the above-mentioned processes, so it is not repeated herein.

In this embodiment, the substrate can be a flexible substrate, and a material of the flexible substrate comprises plastic, metal foil, stainless steel and so on. However, the substrate is not limited to a flexible substrate only. Take the liquid crystal display panel using a glass substrate, a silicon substrate or another rigid substrate for example, although it is not easy to warp the rigid substrates, they would still be warped by gravity with increased size of the liquid crystal display panel. The scan lines and the data lines may crack during the fabrication process. Thus, the pixel array of the present invention can be applied to the rigid substrate to solve the above-mentioned problems.

Second Embodiment

Figure 3A:
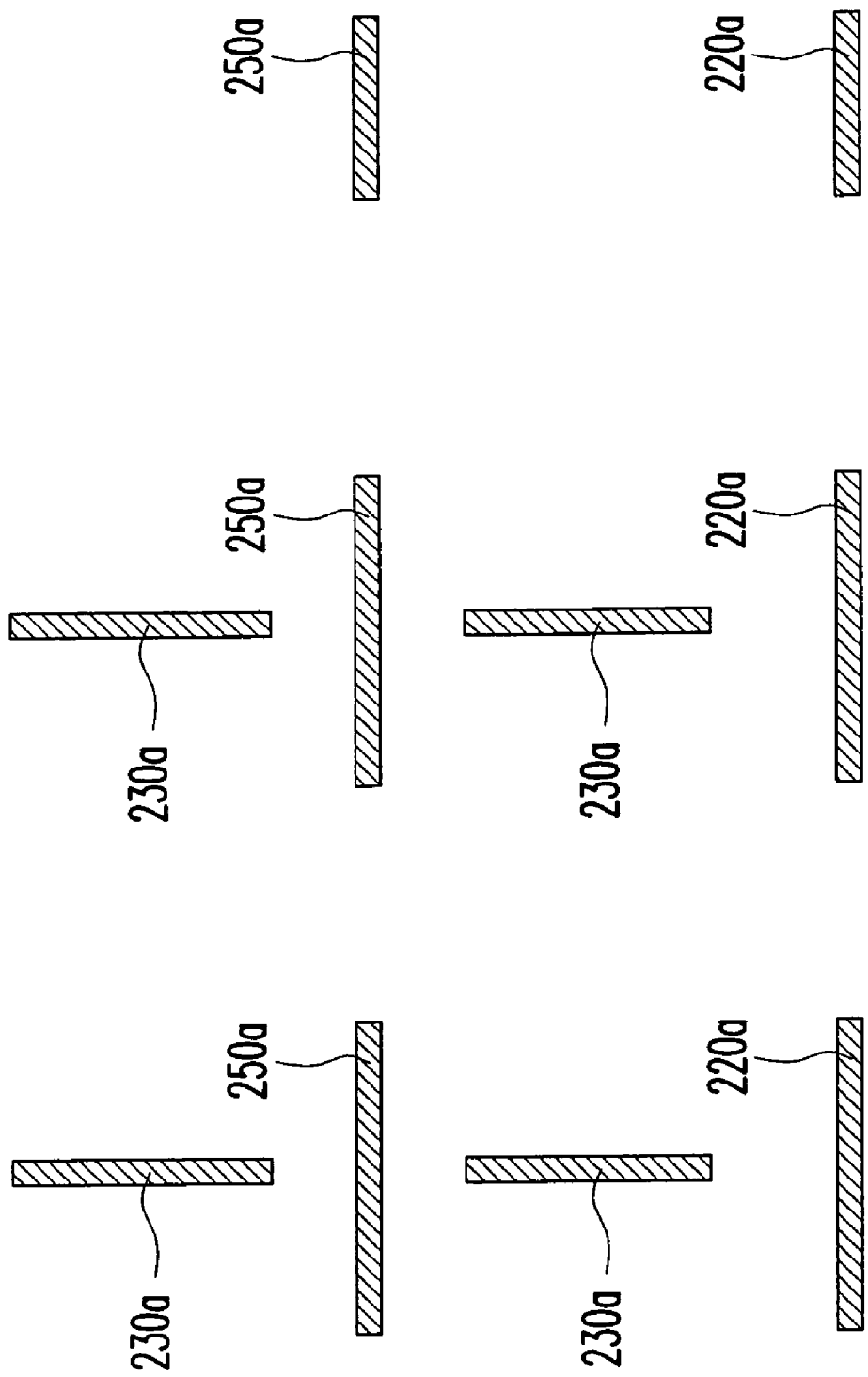
FIGS. 3A to 3C are schematic views illustrating the process flow for fabricating a pixel array according to a second embodiment of the present invention.
Figure 3B:
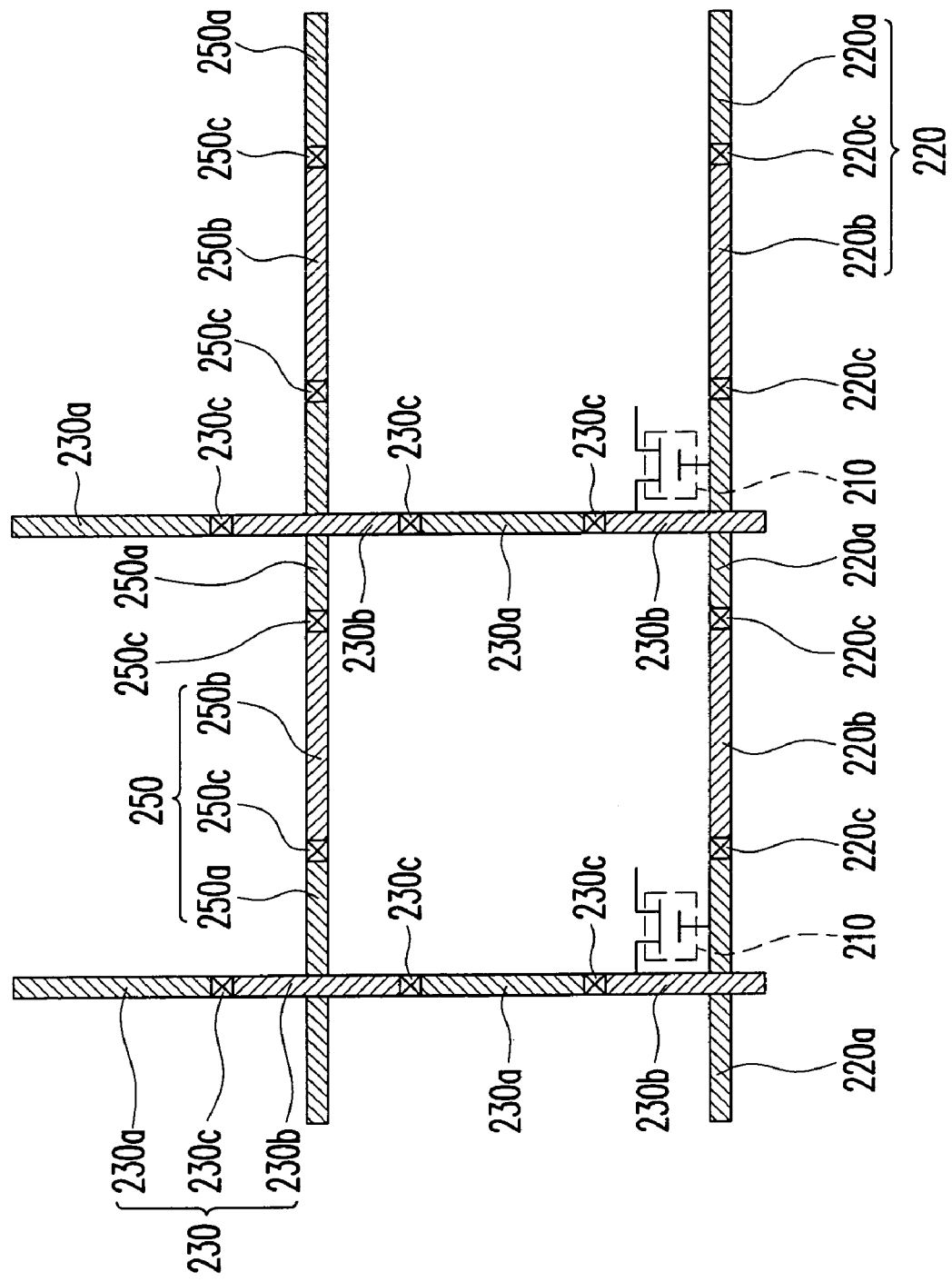
Figure 3C:
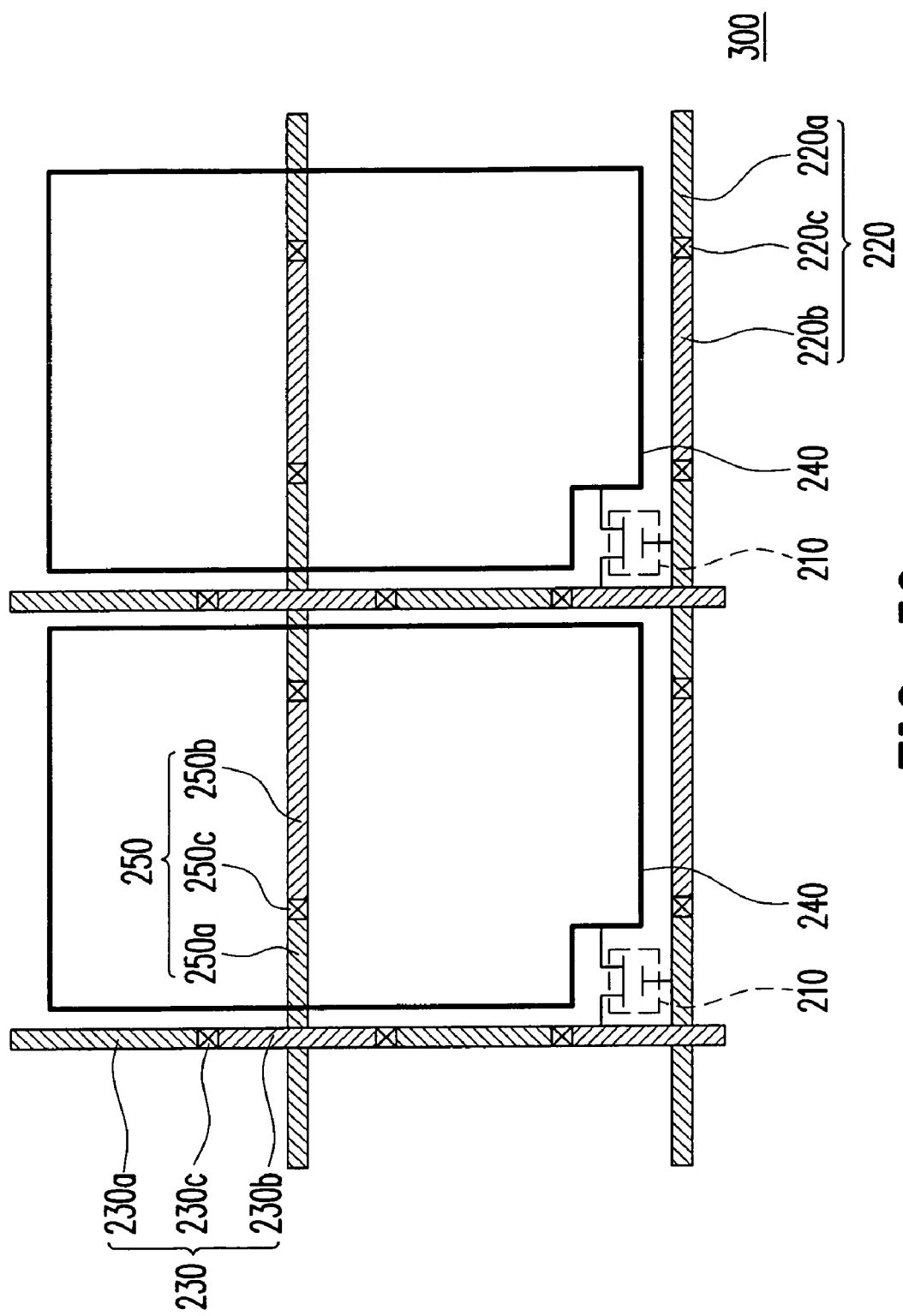

FIGS. 3A to 3C are schematic views illustrating the process flow for fabricating a pixel array according to a second embodiment of the present invention. Please refer to FIGS. 3A to 3C, the pixel array 300 of the second embodiment is similar to the pixel array 200 of the first embodiment (as shown in FIG. 2C). The difference between them is that the pixel array 300 further comprises a plurality of common lines 250. The fabrication process of the pixel array 300 is illustrated in the following. First, please refer to FIG. 3A, except for forming the first scan line patterns 220a and the first data line patterns 230a, a plurality of first common line patterns 250a are formed on the substrate. Next, as shown in FIG. 3B, except for forming the second scan line patterns 220b and the second data line patterns 230b, a plurality of second common line patterns 250b are formed. Similarly, the first common line patterns 250a are electrically connected to the second common line patterns 250b via a plurality of third contact windows 250c to form the common lines 250. The fabrication process of the third contact windows 250c can be the same as that of the first contact window 220c, so it is not repeated herein.

The common lines 250 are formed in the pixel array 300 and maintain a common voltage $V_{com}$. Because the common lines 250 are longer, the invention utilizes a plurality of conductive patterns to constitute each common line 250. Thus, this design can prevent the common lines 250 from cracking due to the warped substrate, and the quality and reliability of the pixel array 300 can be improved.

Note that this design of the wires composed of conductive patterns disposed at different layers is not limited to the scan lines 220, the data line 230 or the common lines 250. Any wires in the pixel array of the present invention can be composed of the first conductive patterns, the second conductive patterns and the fourth contact windows. The fabrication process of the first conductive patterns, the second conductive patterns and the fourth contact windows can be the same as that of the first scan line patterns 220a, the second scan line patterns 220b and the first contact window 220c. The invention can be applied to any wires which crack easily due to the warped substrate. For example, the wires can be fan-out circuits, shorting bars, repairing lines, power lines and so on.

No matter the pixel array 200 of the first embodiment or the pixel array 300 of the second embodiment, the number of mask used in the fabrication process is the same as that used in the conventional fabrication process. Accordingly, the fabrication cost would not be increased due to the special design of wires.

In the pixel array of the present invention, the active devices can be top gate thin film transistors or bottom gate thin film transistors. Besides, a plurality of trenches can be formed in the lower dielectric layer or the upper dielectric layer, such that the dielectric layers can be divided into a plurality of independent dielectric patterns. When the substrate is warped, the stress can be distributed to each dielectric pattern to prevent the dielectric layer from cracking. The arrangement of top gate thin film transistor and bottom gate thin film transistor with the dielectric patterns are illustrated in the following embodiments.

Third Embodiment

Figure 4A:
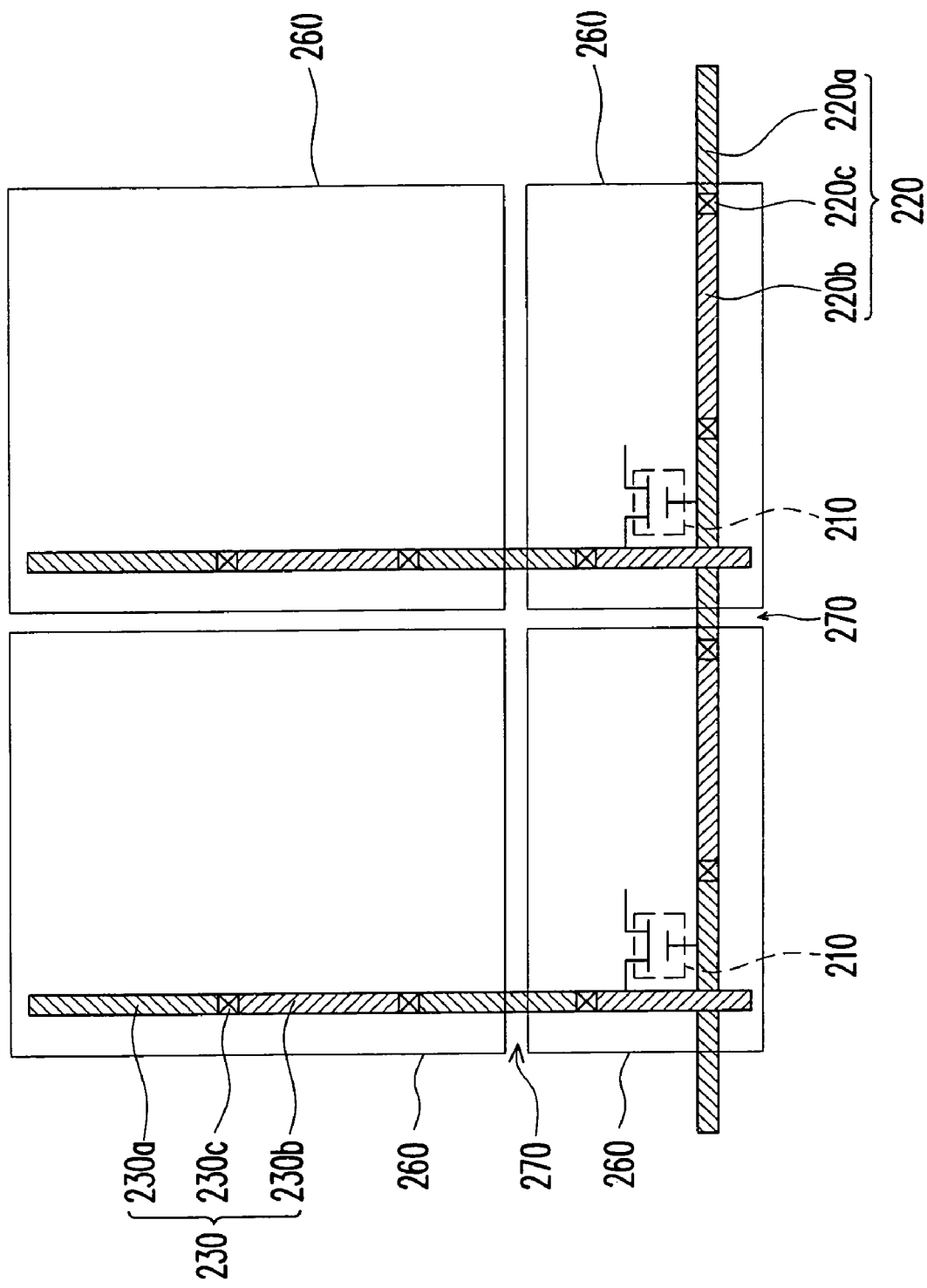
FIGS. 4A and 4B are schematic views illustrating the process flow for fabricating a pixel array according to a third embodiment of the present invention.
Figure 4B:
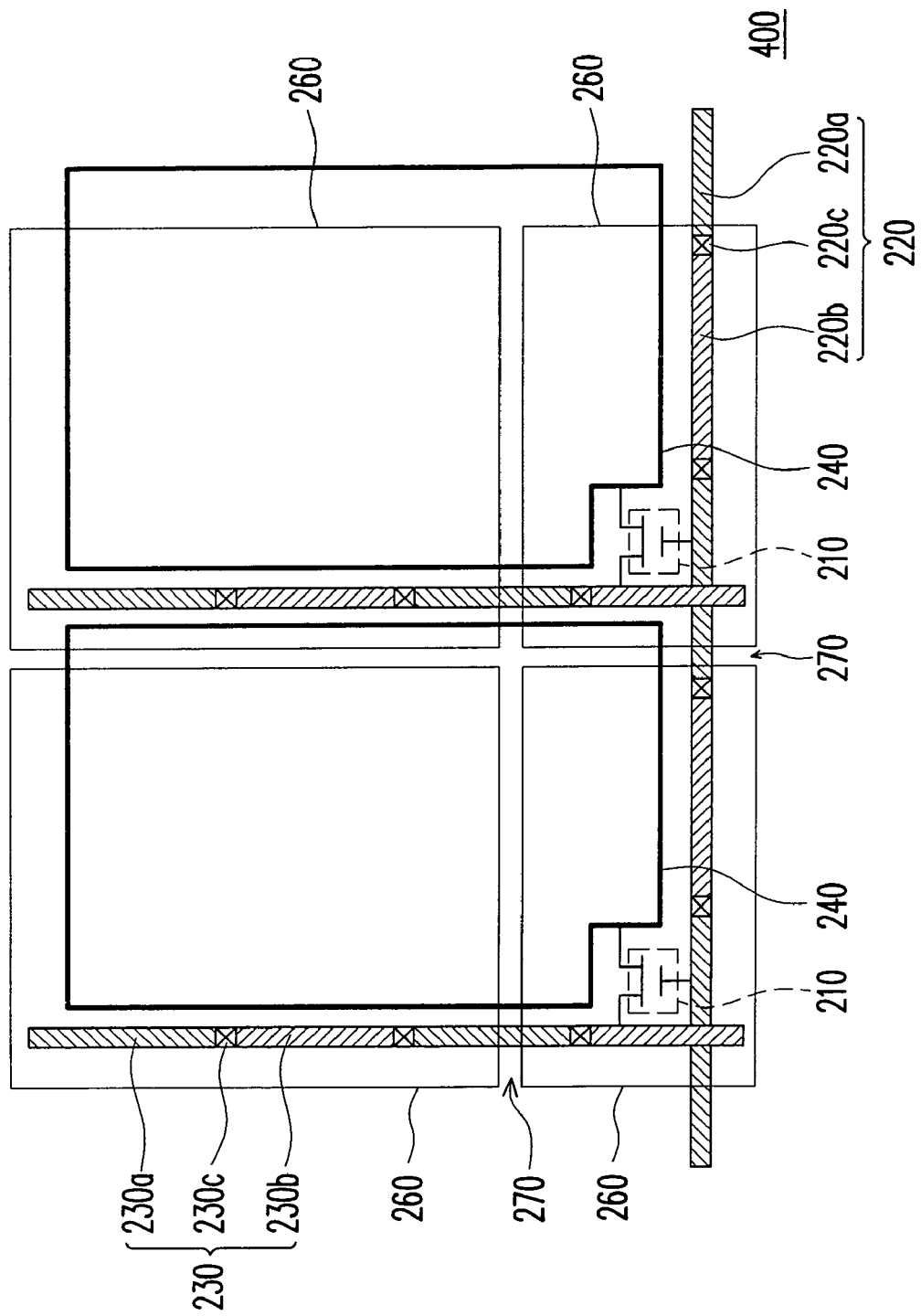

FIGS. 4A and 4B are schematic views illustrating the process flow for fabricating a pixel array according to a third embodiment of the present invention. Please refer to FIGS. 4A and 4B, the pixel array 400 of the third embodiment is similar to the pixel array 200 (as shown in FIG. 2C) of the first embodiment. The difference between them is that a plurality of trenches 270 are formed in the dielectric layer of the pixel array 400 in order to form a plurality of independent dielectric patterns 260. Please refer to FIG. 4A, after the active devices 210, the scan lines 220 and the data lines 230 are formed, an upper dielectric layer (not shown) is deposited. Next, the trenches 270 are formed in the upper dielectric layer and the lower dielectric layer (not shown) by a photolithography process and an etching process, so as to form a plurality of independent dielectric patterns 260. Please refer to FIG. 4B, after the pixel electrodes 240 are formed, the fabrication process of the pixel array 400 is completed. The upper dielectric layer is disposed between the pixel electrode 240 and the data line 230, and the lower dielectric layer is disposed between the data line 230 and the scan line 220.

Figure 5C:
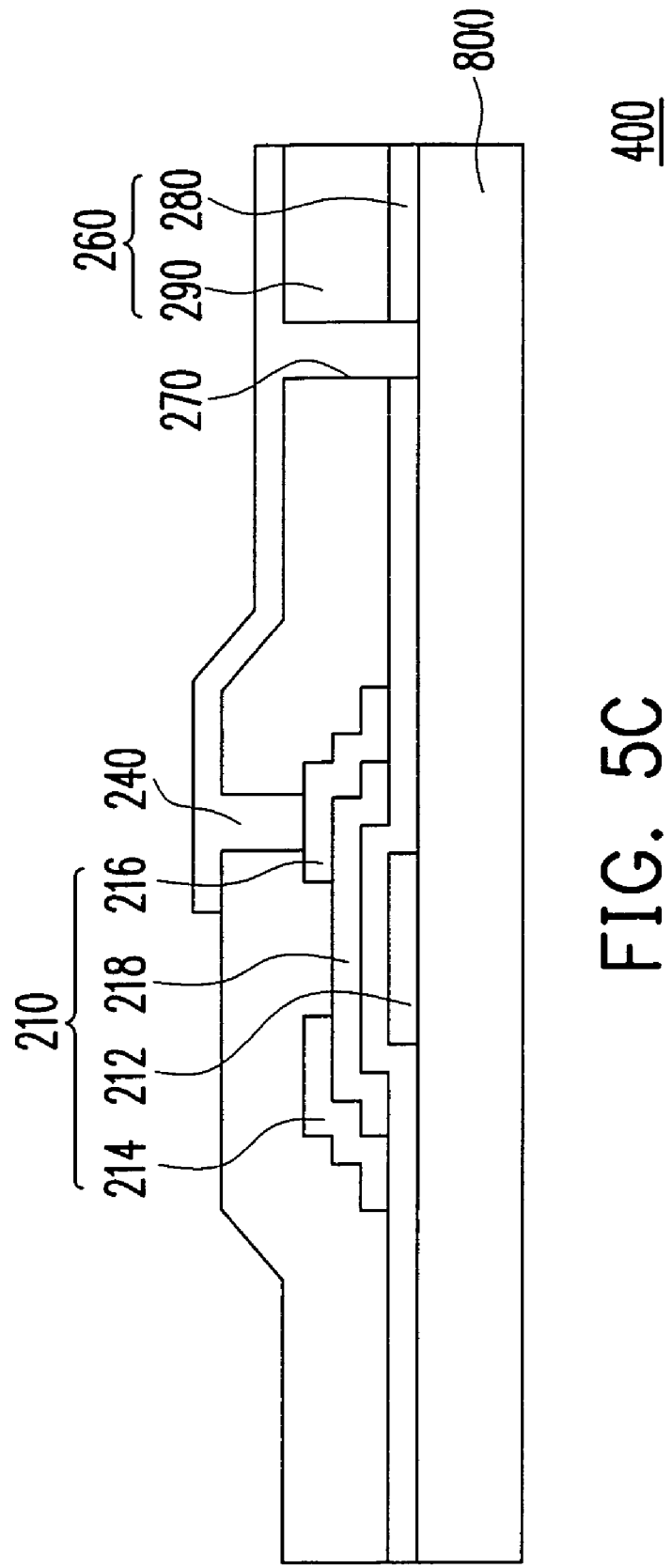

FIGS. 5A to 5C are schematic cross-section views illustrating the process flow for fabricating a pixel array according to a third embodiment of the present invention. The diagrams take the active device 210 shown in FIG. 4B as an example for illustration, and the active device 210 is a bottom gate thin film transistor. Please refer to FIG. 5A, the active device 210 is formed on a substrate 800, which comprises a gate 212, a source 214, a drain 216 and a channel 218. The gate 212 is formed during the process of forming the first scan line patterns 220a; the channel 218 is formed after the lower dielectric layer 280 has been formed; the source 214 and the drain 216 are formed during the process of forming the second data line patterns 230b. An upper dielectric layer 290 is deposited on the lower dielectric layer 280 and the active device 210; the material of the lower dielectric layer 280 and the upper dielectric layer 290 can be inorganic material or organic material. Please continue to refer to FIG. 5B, a trench 270 is formed in the lower dielectric layer 280 and the upper dielectric layer 290, such that the lower dielectric layer 280 and the upper dielectric layer 290 can be divided into a plurality of independent dielectric patterns 260. Therefore, the trench 270 can prevent the lower dielectric layer 280 and the upper dielectric layer 290 from cracking when strain stress or tensile stress is applied to the substrate 800. Besides, a contact window opening 290a can be formed simultaneously when forming the trench 290 by an etching process. Finally, please refer to FIG. 5C, the pixel electrode 240 is formed. Thus far, the pixel array 400 is formed according to the above processes. This step can further comprise a process that the material of the pixel electrode 240 is filled in the contact window opening 290a, such that the pixel electrode 240 is electrically connected to the drain 216 of the active device 210.

Fourth Embodiment

Figure 6A:
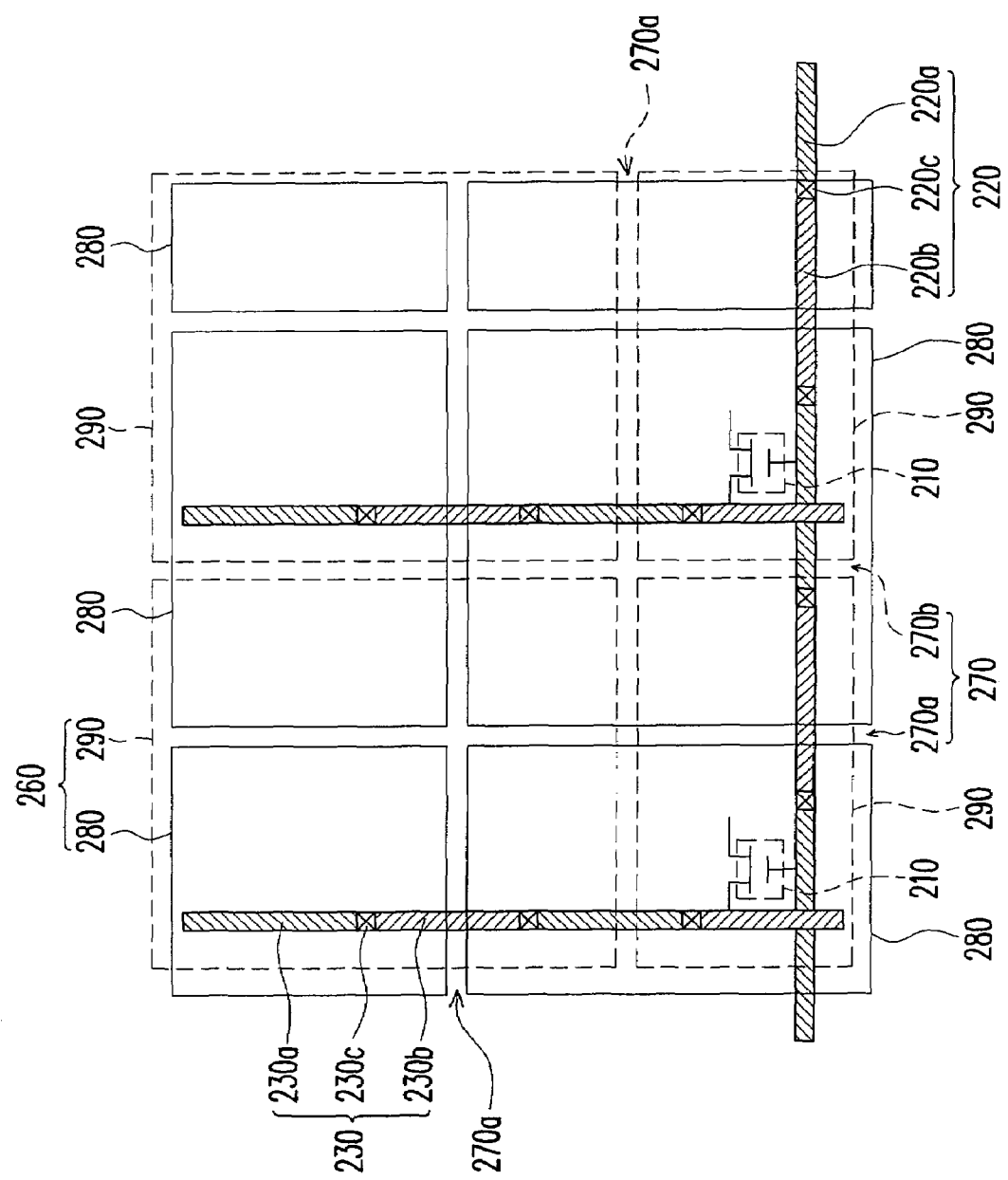
FIGS. 6A and 6B are schematic views illustrating the process flow for fabricating a pixel array according to a fourth embodiment of the present invention.
Figure 6B:
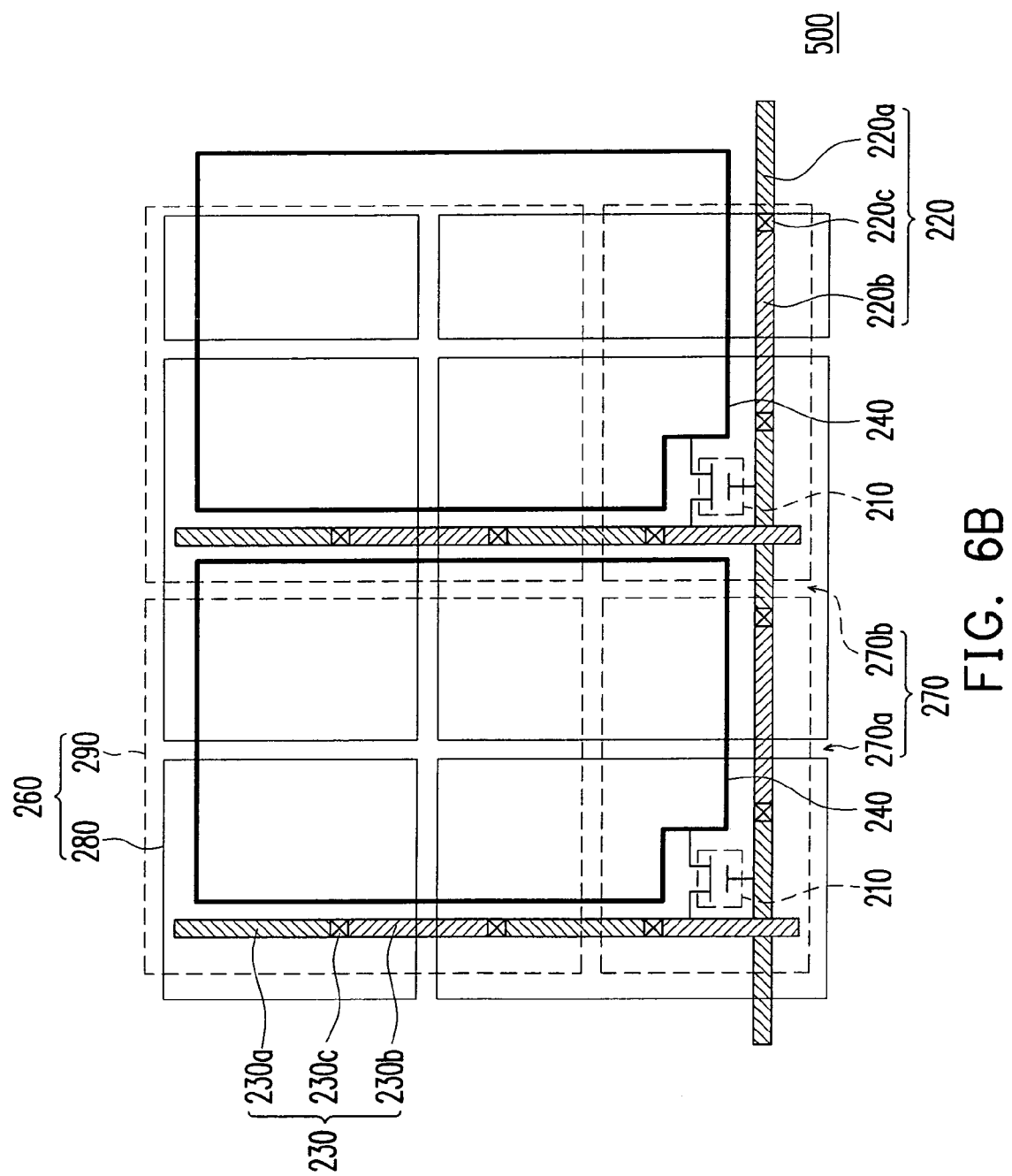

FIGS. 6A and 6B are schematic views illustrating the process flow for fabricating a pixel array according to a fourth embodiment of the present invention. Please refer to FIGS. 6A and 6B, the pixel array 500 of the fourth embodiment is similar to the pixel array 400 (as shown in FIG. 4B) of the third embodiment. The difference between them is that the active device 210 of the pixel array 500 is a top gate thin film transistor, and the lower dielectric layer 280 and the upper dielectric layer 290 are divided into a plurality of independent dielectric patterns 260 by a first trench 270a and a second trench 270b respectively. The first trench 270a and the second trench 270b are staggered. The fabrication process of the pixel array 500 is illustrated in the following with the accompanying drawings.

FIGS. 7A to 7E are schematic cross-section views illustrating the process flow for fabricating a pixel array according to a fourth embodiment of the present invention. The diagrams take the active device 210 shown in FIG. 6B as an example for illustration. Please refer to FIG. 7A, the active device 210 is formed on a substrate 800 and comprises a gate 212, a source 214, a drain 216 and a channel 218. The method of fabricating the active device 210 comprises the following steps. The source 214, the drain 216 and the channel 218 are formed on the substrate 800, and then a first lower dielectric layer 280a is deposited. Next, the gate 212 is formed simultaneously when forming the first scan line patterns 220a, and thus far the active device 210 is formed according to the above processes. After that, a second lower dielectric layer 280b is deposited for protecting the active device 210. The first lower dielectric layer 280a and the second lower dielectric layer 280b constitute the lower dielectric layer 280.

Figure 7A:
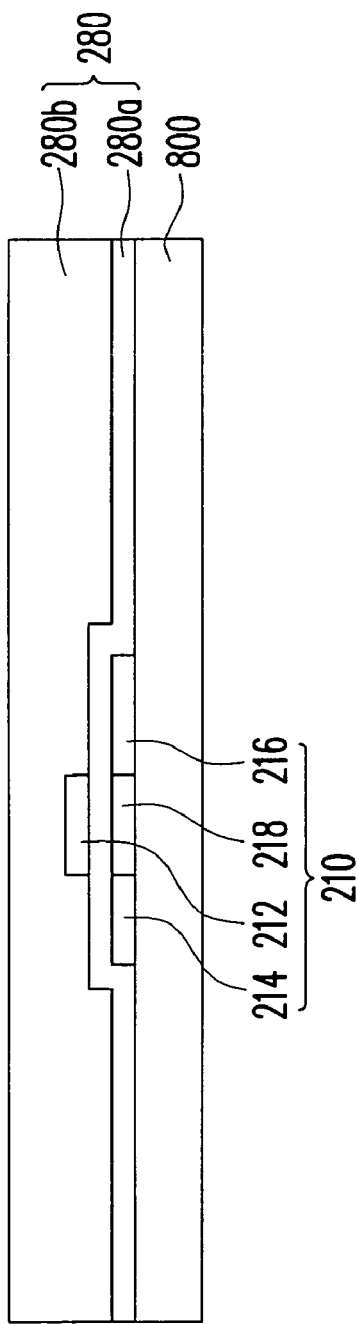
Figure 7B:
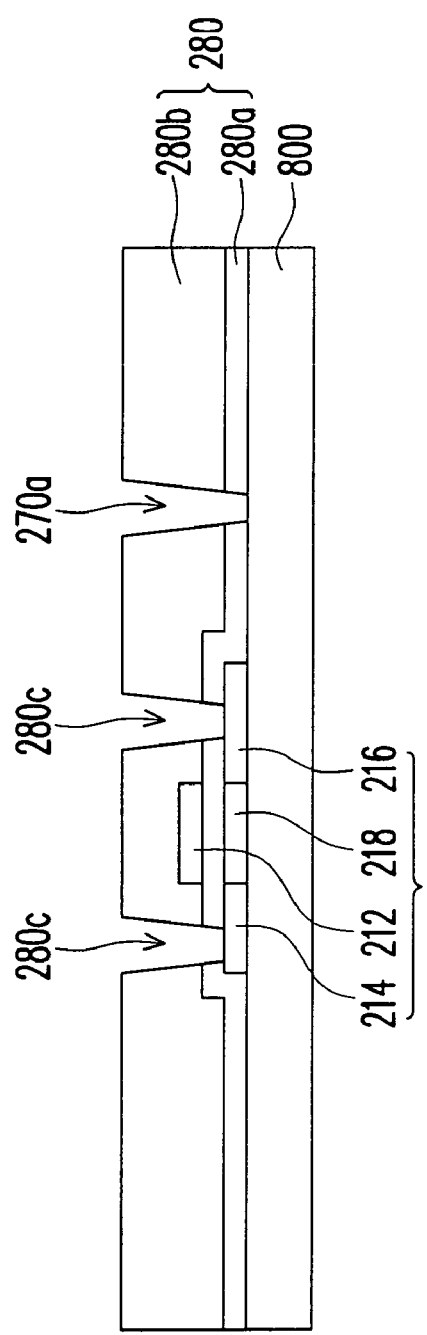
Figure 7E:
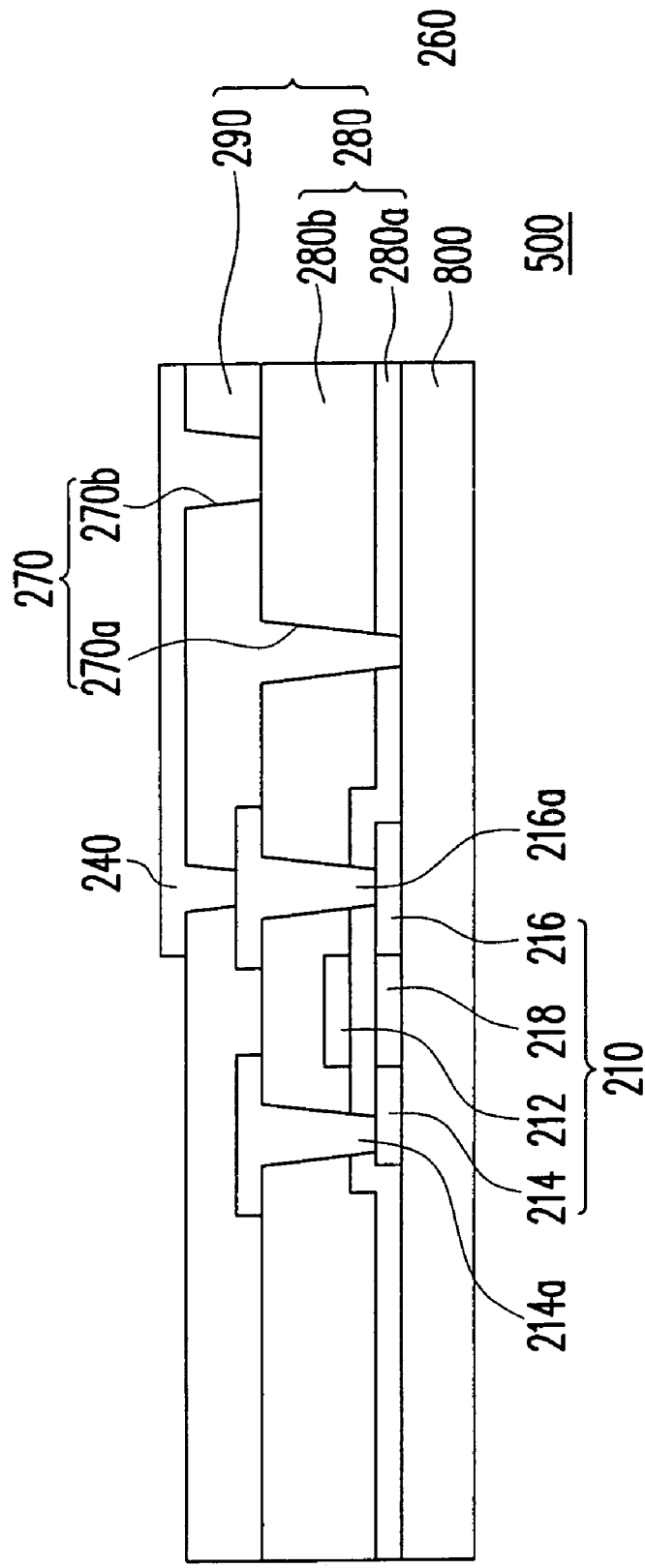

Please refer to FIG. 7B, a first trench 270a is formed in the lower dielectric layer 280, such that the lower dielectric layer 280 is divided into a plurality of independent dielectric patterns 260 so as to prevent the lower dielectric layer 280 from cracking. Furthermore, a contact window opening 280c can be formed simultaneously when forming the first trench 270a to expose the source 214 and the drain 216. Then, please refer to FIG. 7C, during the step of forming the second data line patterns 230b, the material of the second data line patterns 230b is filled with the contact window opening to form conductive layers 214a, 216a which electrically connect the source 214 and the drain 216. Next, an upper dielectric layer 290 is deposited to protect the components underneath.

Please continue to refer to FIG. 7D, a second trench 270b is formed in the upper dielectric layer 290, such that the upper dielectric layer 290 is divided into a plurality of independent dielectric patterns 260 to prevent the upper dielectric layer 290 from cracking. In this embodiment, the first trench 270a and the second trench 270b are staggered. However, in other embodiments, the first trench and the second trench can be arranged in the same position to expose the substrate directly. The position of the trenches is not limited in the present invention. Besides, a contact window opening 290a can be formed simultaneously when forming the second trench 270b. Finally, please refer to FIG. 7E, the pixel electrode 240 is formed. Thus far, the pixel array 500 is formed according to the above processes. This process also comprises a step that the contact window opening 290a is filled with the material of the pixel electrode 240, such that the pixel electrode 240 is electrically connected to the drain 216 of the active device 210 via the conductive layer 216a.

In the third and fourth embodiments, the pixel arrays 400, 500 comprise a plurality of segmented conductive patterns disposed at different layers and independent dielectric patterns. However, the pixel array of the present invention may comprise the independent dielectric patterns only. The top gate thin film transistor and the bottom gate thin film transistor having the independent dielectric patterns are respectively illustrated in the following.

Fifth Embodiment

Figure 8:
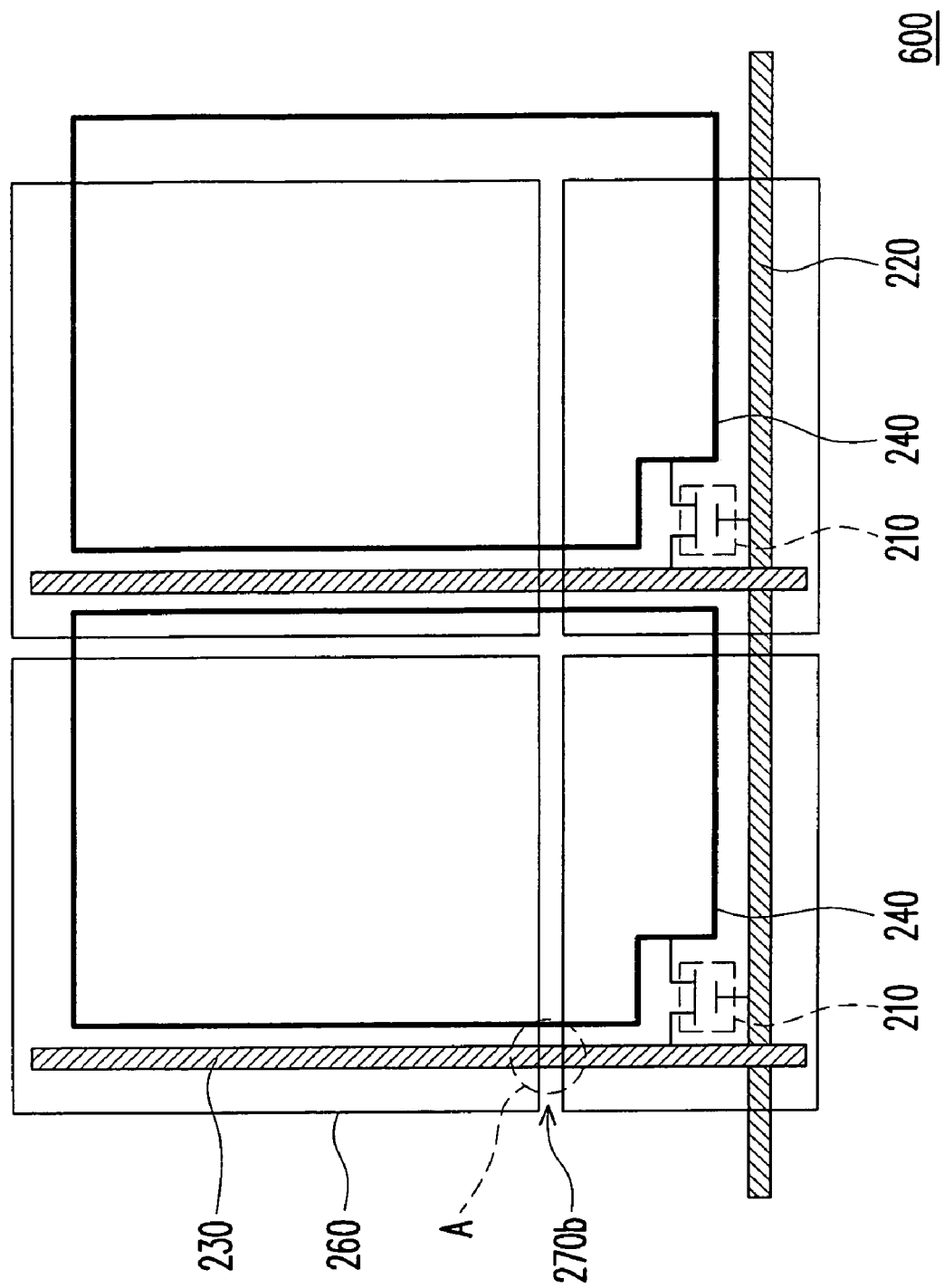
FIG. 8 is a schematic view showing a pixel array according to a fifth embodiment of the present invention.

FIG. 8 is a schematic view showing a pixel array according to a fifth embodiment of the present invention. Please refer to FIG. 8, the pixel array 600 of the fifth embodiment 600 is similar to the pixel array 400 (as shown in FIG. 4B) of the third embodiment. The difference between them is that the scan lines 220 and the data lines 230 of the pixel array 600 are not segmented or separately layered. Please refer to FIG. 8, in this embodiment, the scan lines 220 of the pixel array 600 are made of single-layer wires, and the data lines 230 are made of other single-layer wires. Besides, as shown in the region A of FIG. 8, the data line 230 is disposed above the upper dielectric layer (not shown). Therefore, the lower dielectric layer disposed below the data line 230 can not be etched because of the data line 230 during the step of etching the trench 270. Nevertheless, the area of region A is limited. Although the dielectric patterns 260 can not be divided into a plurality of independent dielectric patterns completely, this design still has a function of protecting the dielectric layer from cracking compared with the conventional dielectric layer which is a complete layer without being sliced. Note that if the data line 230 disposed in the region A is replaced with the first data line pattern 230a in the pixel array 400 of the third embodiment, the foregoing problem can be resolved because the first data line pattern 230a is disposed under the lower dielectric layer.

Sixth Embodiment

Figure 9:
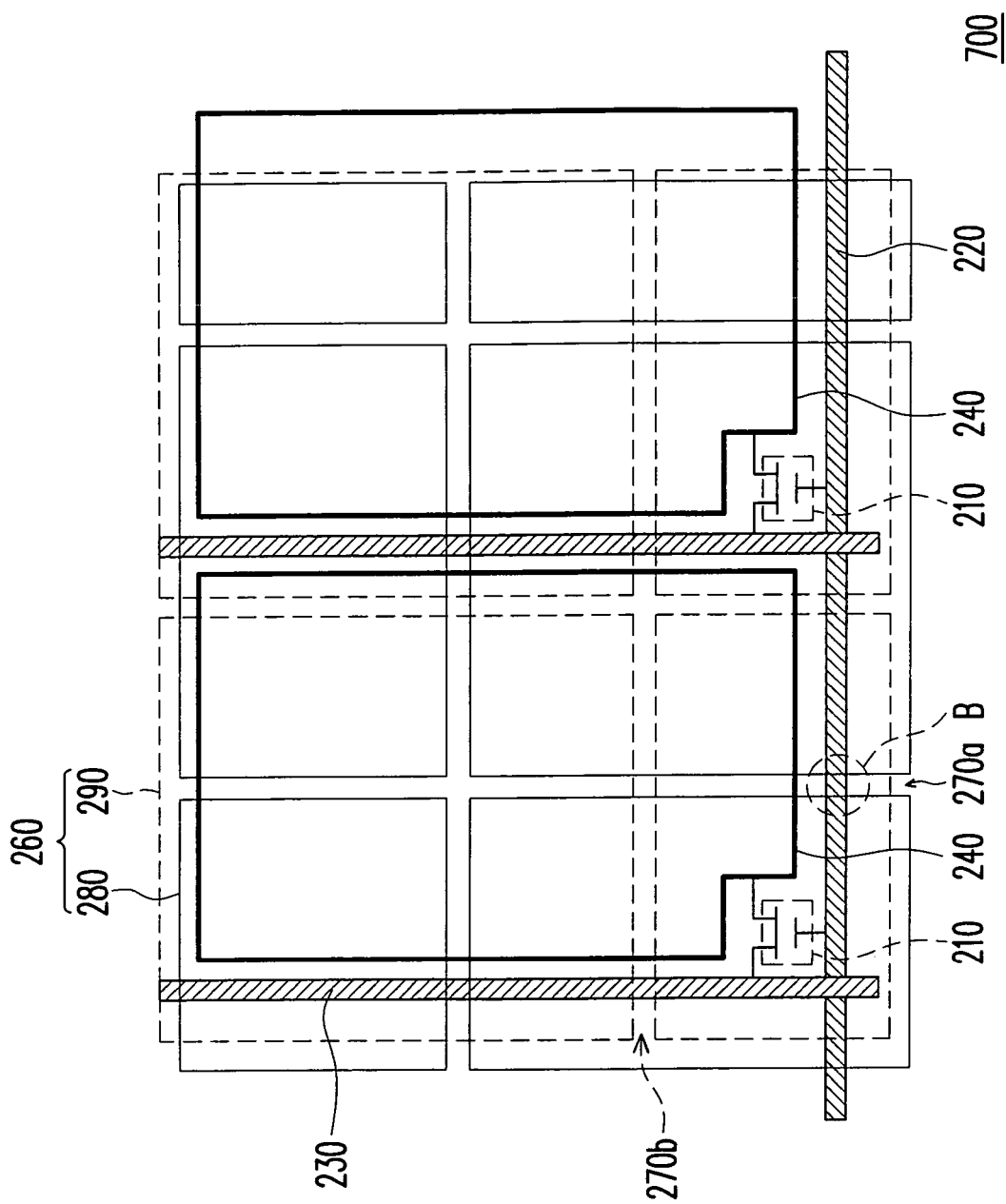
FIG. 9 is a schematic view showing a pixel array according to a sixth embodiment of the present invention.

FIG. 9 is a schematic view showing a pixel array according to a sixth embodiment of the present invention. Please refer to FIG. 9, the pixel array 700 of the sixth embodiment 700 is similar to the pixel array 500 (as shown in FIG. 6B) of the fourth embodiment. The difference between them is that the scan lines 220 and the data lines 230 of the pixel array 700 are not segmented or separately layered. Please refer to FIG. 9, in this embodiment, the scan lines 220 of the pixel array 700 are made of single-layer wires, and the data lines 230 are made of other single-layer wires. Besides, as shown in the region B of FIG. 9, the scan line 220 is disposed above the first lower dielectric layer (not shown) of the lower dielectric layer 280. Therefore, the first lower dielectric layer disposed below the scan line 220 can not be etched because of the scan line 220 during the step of etching the first trench 270a. However, the area of region B is limited. Although the dielectric patterns 260 can not be divided into a plurality of independent dielectric patterns completely, this design still has a function of protecting the dielectric layer from cracking compared with the conventional dielectric layer which is a complete layer without being sliced.

No matter the pixel array 400 of the third embodiment, the pixel array 500 of the fourth embodiment, the pixel array 600 of the fifth embodiment or the pixel array 700 of the sixth embodiment, the number of masks used in the fabrication process is the same as that used in the conventional fabrication process. Accordingly, the fabrication cost would not be increased due to the special design of the dielectric layers.

Besides, the pixel array of the present invention can be applied to liquid crystal displays, organic electro-luminescence displays, polymer electroluminescence displays and the like.

In summary, the pixel array of the present invention at least has the following advantages:

1. The scan lines, the data lines, the common lines or other wires in the pixel array of the present invention can be composed of the conductive patterns disposed at different layers and the contact windows for electrically connecting the conductive patterns at different layers. When the substrate is warped, this design can prevent the lines from cracking. Further, the quality and reliability of the pixel array is enhanced.

2. The dielectric layers are divided into a plurality of independent dielectric patterns by forming the trench/trenches therein. Therefore, when the substrate is warped, the dielectric layers would not crack easily. Thus, the quality and the reliability of the pixel array can be enhanced.

3. Compared with the prior art, the number of masks used in the fabrication process of the present invention is the same as that used in the conventional fabrication process. Accordingly, the fabrication cost would not be increased, and the competitiveness of the pixel array of the present invention is upgraded.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel array comprising a plurality of active devices disposed on a substrate, a plurality of scan lines and a plurality of data lines electrically connected to the active devices, and a plurality of pixel electrodes electrically connected to the active devices, the pixel array characterized in that:
   each scan line comprising a plurality of first scan line patterns disposed in a first layer, a plurality of second scan line patterns disposed in an second layer and a plurality of first contact windows electrically connecting the first scan line patterns and the second scan line patterns; and
   each data line comprising a plurality of first data line patterns disposed in the first layer, a plurality of second data line patterns disposed in the second layer and a plurality of second contact windows electrically connecting the first data line patterns and the second data line patterns.

2. The pixel array according to claim 1, further comprising a plurality of common lines, and each common line comprising a plurality of first common line patterns disposed in the first layer, a plurality of second common line patterns disposed in the second layer and a plurality of third contact windows electrically connecting the first common line patterns and the second common line patterns.

3. The pixel array according to claim 1, further comprising a plurality of dielectric layers respectively disposed between the pixel electrodes and the data lines, and the scan lines and the data lines, wherein the dielectric layer has at least one trench therein, so as to divide the dielectric layer into a plurality of independent dielectric patterns.

4. The pixel array according to claim 3, wherein a material of the dielectric layer comprises inorganic material or organic material.

5. The pixel array according to claim 3, wherein the active devices are top gate thin film transistors, the dielectric layer comprises a lower dielectric layer and an upper dielectric layer, and the trench comprises a first trench disposed in the lower dielectric layer and a second trench disposed in the upper dielectric layer.

6. The pixel array according to claim 5, wherein the first trench and the second trench are staggered.

7. The pixel array according to claim 3, wherein the active devices are bottom gate thin film transistors.

8. The pixel array according to claim 3, wherein the substrate is a flexible substrate.

9. The pixel array according to claim 8, wherein a material of the flexible substrate comprises plastic, metal foil or stainless steel.

10. The pixel array according to claim 1, further comprising a plurality of wires disposed on the substrate, wherein each wire comprises a plurality of first wire patterns disposed in the first layer, a plurality of second wire patterns disposed in the second layer and a plurality of fourth contact windows electrically connecting the first wire patterns and the second wire patterns.

11. A pixel array comprising a plurality of active devices disposed on a substrate, a plurality of scan lines and a plurality of data lines electrically connected to the active devices, and a plurality of pixel electrodes electrically connected to the active devices, the pixel array characterized in that:
   a dielectric layer disposed between the pixel electrodes and the scan lines, and the scan lines and the data lines respectively, wherein the dielectric layers have at least one trench therein so as to divide the dielectric layer into a plurality of independent dielectric patterns.

12. The pixel array according to claim 11, wherein the active devices are top gate thin film transistors, the dielectric layer comprises a lower dielectric layer and an upper dielectric layer, and the trench comprises a first trench disposed in the lower dielectric layer and a second trench disposed in the upper dielectric layer.

13. The pixel array according to claim 12, wherein the first trench and the second trench are staggered.

14. The pixel array according to claim 11, wherein the active devices are bottom gate thin film transistors.

15. The pixel array according to claim 11, wherein the substrate is a flexible substrate.

16. The pixel array according to claim 15, wherein a material of the flexible substrate comprises plastic, metal foil or stainless steel.

17. The pixel array according to claim 11, wherein a material of the dielectric layer comprises inorganic material or organic material.

18. The pixel array according to claim 11, further comprising a plurality of wires disposed on the substrate.

* * * * *